United States Patent
Yang

(10) Patent No.: US 9,583,382 B2
(45) Date of Patent: Feb. 28, 2017

(54) INTERCONNECTION STRUCTURE INCLUDING AIR GAP, SEMICONDUCTOR DEVICE INCLUDING AIR GAP, AND METHOD OF MANUFACTURING THE SAME

(71) Applicant: SK hynix Inc., Gyeonggi-do (KR)

(72) Inventor: Ki Hong Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/017,026

(22) Filed: Feb. 5, 2016

(65) Prior Publication Data
US 2016/0155659 A1    Jun. 2, 2016

Related U.S. Application Data

(62) Division of application No. 14/190,990, filed on Feb. 26, 2014, now Pat. No. 9,287,198.

(30) Foreign Application Priority Data

Sep. 27, 2013    (KR) .................. 10-2013-0115522

(51) Int. Cl.
| | | |
|---|---|---|
| H01L 21/768 | (2006.01) |
| H01L 21/02 | (2006.01) |
| H01L 27/115 | (2006.01) |
| H01L 23/48 | (2006.01) |

(52) U.S. Cl.
CPC .... *H01L 21/7682* (2013.01); *H01L 21/02274* (2013.01); *H01L 21/76802* (2013.01); *H01L 21/76877* (2013.01); *H01L 21/76897* (2013.01); *H01L 23/481* (2013.01); *H01L 27/11556* (2013.01); *H01L 27/11582* (2013.01); *H01L 2924/0002* (2013.01)

(58) Field of Classification Search
CPC .......... H01L 21/7682; H01L 21/76849; H01L 2224/13; H01L 21/76897; H01L 21/02274; H01L 21/76877; H01L 21/76802; H01L 27/11556; H01L 27/11582; H01L 23/481; H01L 27/105; H01L 27/1052
USPC ....................................... 438/643
See application file for complete search history.

(56) References Cited

U.S. PATENT DOCUMENTS

| | | | | |
|---|---|---|---|---|
| 2008/0029899 A1* | 2/2008 | Song | ................ | H01L 21/76897 257/774 |
| 2009/0298282 A1* | 12/2009 | Yun | ..................... | H01L 21/7682 438/653 |
| 2011/0298013 A1* | 12/2011 | Hwang | ............. | H01L 27/11551 257/208 |

* cited by examiner

Primary Examiner — Thomas L Dickey
Assistant Examiner — Changhyun Yi
(74) Attorney, Agent, or Firm — IP & T Group LLP

(57) ABSTRACT

A semiconductor device includes a first insulating layer, a second insulating layer formed on the first insulating layer, a plurality of interconnection lines formed in the second insulating layer, and a first air gap disposed between the first insulating layer and the second insulating layer to surround a lower part of the interconnection lines.

15 Claims, 9 Drawing Sheets

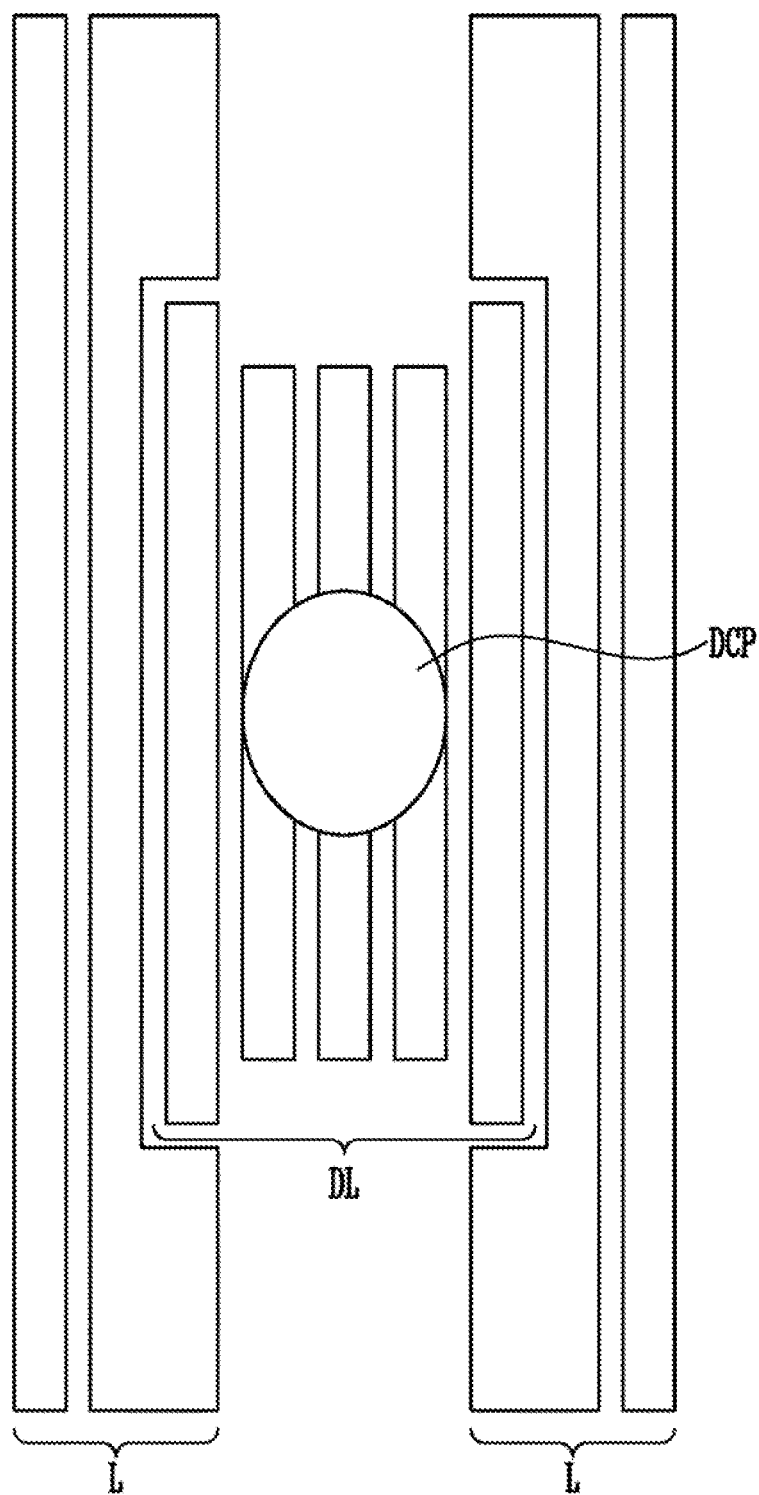

INTERCONNECTION STRUCTURE INCLUDING AIR GAP, SEMICONDUCTOR DEVICE INCLUDING AIR GAP, AND METHOD OF MANUFACTURING THE SAME

CROSS-REFERENCE TO RELATED APPLICATION

This application is a division of U.S. patent application Ser. No. 14/190,990 filed on Feb. 26, 2014, which claims priority of Korean patent application number 10-2013-0115522, filed on Sep. 27, 2013, in the Korean Intellectual Property Office. The entire disclosure of each of the foregoing applications is incorporated herein by reference in its entirety.

BACKGROUND

Field of Invention

Various embodiments of the present invention relates to an electronic device and a method of manufacturing the same. More specifically, the present invention relates to an interconnection structure, a semiconductor device having the interconnection structure, and a method of manufacturing the semiconductor device.

Description of Related Art

A semiconductor device includes a variety of interconnection lines for transmitting signals. However, with the increase in an integration degree of semiconductor devices, a space between the interconnection lines becomes increasingly narrow. The narrowed space may increase capacitance between adjacent interconnection lines, increase a loading effect, and degrade program characteristics.

SUMMARY

Various embodiment of the present invention are directed to an interconnection structure with improved characteristics, a semiconductor device, and a method of manufacturing the same.

One aspect of the present invention provides an interconnection structure including: an insulating layer including a plurality of interconnection lines therein; a first air gap defined in the insulating layer and positioned under the plurality of interconnection lines; and a plurality of second air gaps defined in the insulating layer and positioned between the plurality of interconnection lines.

Another aspect of the present invention provides a semiconductor device including: a first insulating layer; a second insulating layer formed on the first insulating layer; a plurality of interconnection lines formed in the second insulating layer; and a first air gap disposed between the first insulating layer and the second insulating layer to surround a lower part of the interconnection lines.

Still another aspect of the present invention provides a method of manufacturing a semiconductor device including: forming an etch stop layer on a first insulating layer; forming a second insulating layer on the etch stop layer, wherein the second insulating layer includes a plurality of interconnection lines; forming a hole passing through the second insulating layer to expose the etch stop layer; and removing the etch stop layer through the hole to form the first air gap.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 3 illustrates an interconnection line layout of the semiconductor device according to an embodiment of the present invention;

DESCRIPTION OF EMBODIMENTS

Figure 1A:
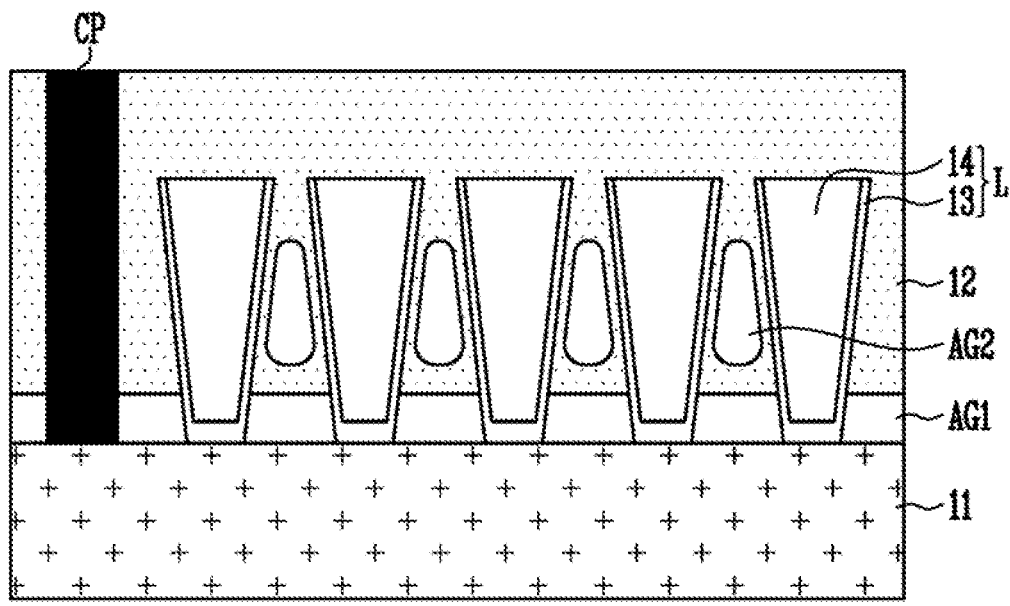
FIGS. 1A and 1B are cross-sectional views of an interconnection structure according to an embodiment of the present invention.

Preferred embodiments of the present invention will be described below. In the drawings, a thickness and spacing are represented for convenience of description, which may be exaggerated and shown, compared to an actual physical thickness. In description of the present invention, a well-known element irrelevant to the substance of the present invention will be omitted. In adding reference numerals to elements in each figure, it should be noted that like reference numerals already used to denote like elements in other figures are used for elements wherever possible. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
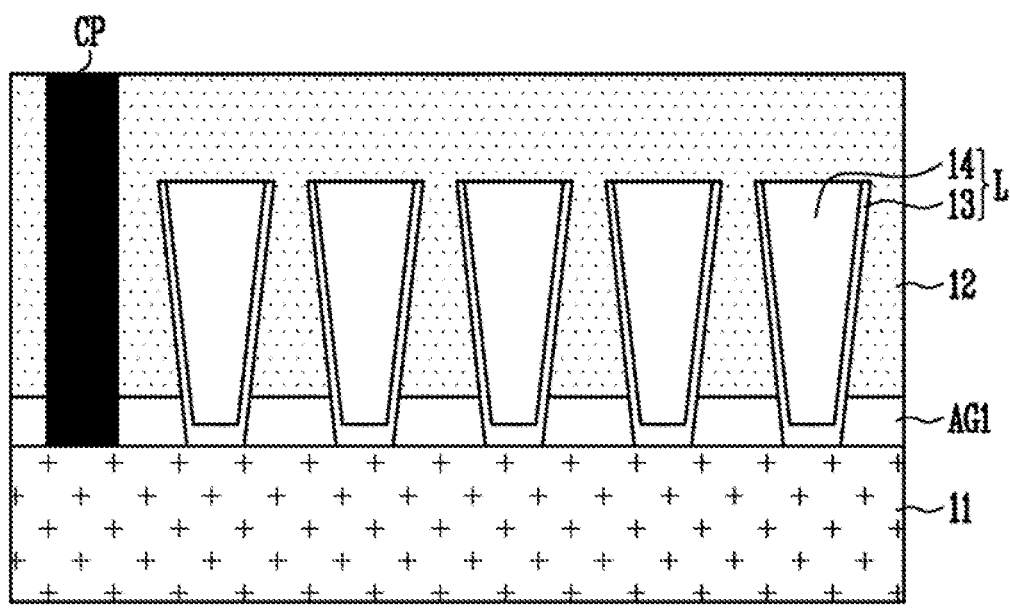

FIGS. 1A and 1B are cross-sectional views of an interconnection structure according to an embodiment of the present invention.

As shown in FIGS. 1A and 1B, the interconnection structure according to an embodiment of the present invention includes insulating layers and a plurality of interconnection lines L formed in the insulating layers.

Here, the insulating layers may include a first insulating layer 11 and a second insulating layer 12 formed on the first insulating layer 11. In addition, the first insulating layer 11 and the second insulating layer 12 may be integrated into one layer or formed by separate processes. Here, the first and second insulating layers 11 and 12 may be interlayer dielectrics, which may be sequentially stacked on a substrate (not shown) having a lower structure formed therein. For example, the first and second insulting layers 11 and 12 include an oxide. In addition, the plurality of interconnection lines L may be formed in the second insulating layer 12 and may include a barrier layer 13 and a metal layer 14. For example, the plurality of interconnection lines L include a metal such as tungsten, copper, or the like.

The interconnection structure according to an embodiment of the present invention may further include a first air gap AG1. Furthermore, the interconnection structure may further include a plurality of second air gaps AG2. Here, each of the air gaps AG1 and AG2 may be an empty space formed in a layer or between layers.

The first air gap AG1 may be defined in a horizontal direction in the insulating layers and positioned at lower portions of the interconnection lines L. For example, the first air gap AG1 may be defined between the first insulating layer 11 and the second insulating layer 12. In addition, the first air gap AG1 may be defined in a region from which an etch stop layer removed. This will be described below with reference to FIGS. 4D and 4E.

The plurality of second air gaps AG2 are defined in the insulating layers and positioned between the interconnection lines L. For example, the second air gaps AG2 are positioned in the second insulating layer 12.

FIG. 1A illustrates a case where the interconnection structure includes both the first air gap AG1 and the second air gaps AG2, and FIG. 1B illustrates a case where the semiconductor device includes only the first air gap AG1. Here, lower portions of the interconnection lines L may protrude into the first air gap AG1, that is, lower portions of the interconnection lines L are surrounded by the first air gap AG1. In addition, the first air gap AG1 and each of the second air gaps AG2 are shown to be separated from each other by the second insulating layer 12 in this drawing, but may be connected to each other.

The interconnection structure may further include at least one dummy contact plug CP that extends to the first air gap AG1 through the insulating layers 11 and 12. Here, the dummy contact plug CP may be positioned in a dummy region, a peripheral region, a guide region, or the like.

According to the above-described structure, it may be possible to reduce capacitance between adjacent interconnection lines L by defining the second air gaps AG2 between the adjacent interconnection lines L. In addition, the capacitance between the adjacent interconnection lines L may be further reduced by defining the first air gap AG1 between the first insulating layer 11 and the second insulating layer 12. Thus, a loading effect of the interconnection lines L and program characteristics may be improved.

The interconnection structure may be included in a semiconductor device. The semiconductor device may include memory cells (not shown) formed on a substrate (not shown). In this case, the first insulating layer 11 may be an interlayer dielectric formed on a substrate having the memory cells formed thereon, and the interconnection lines L may be bit lines. In addition, the memory cells may be horizontally arranged along a surface of the substrate or vertically stacked along a channel layer protruding from the substrate.

As an example, the memory cells are horizontally arranged, and the interconnection lines L are connected to a drain contact region of the substrate. In this case, the interconnection lines L are connected to a drain contact region through contact plugs included in the first insulating layer 11. As another example, the memory cells are vertically stacked, and the interconnection lines L are connected to an end of the channel layer. In this case, the interconnection lines L are connected to a top of the channel layer through the contact plugs included in the first insulating layer 11.

Figure 2A:
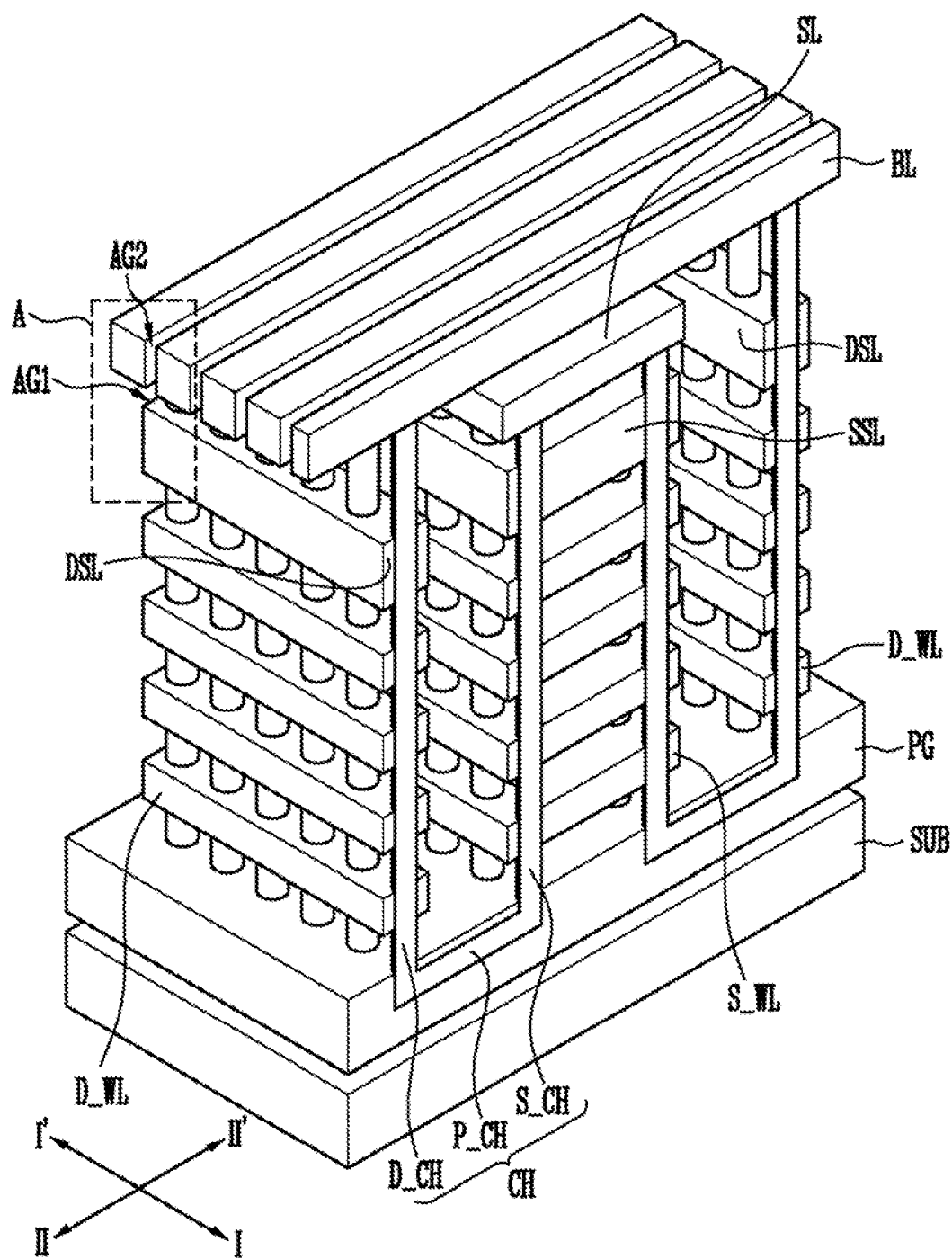
FIGS. 2A and 2B are perspective views of a semiconductor device according to an embodiment of the present invention.
Figure 2B:
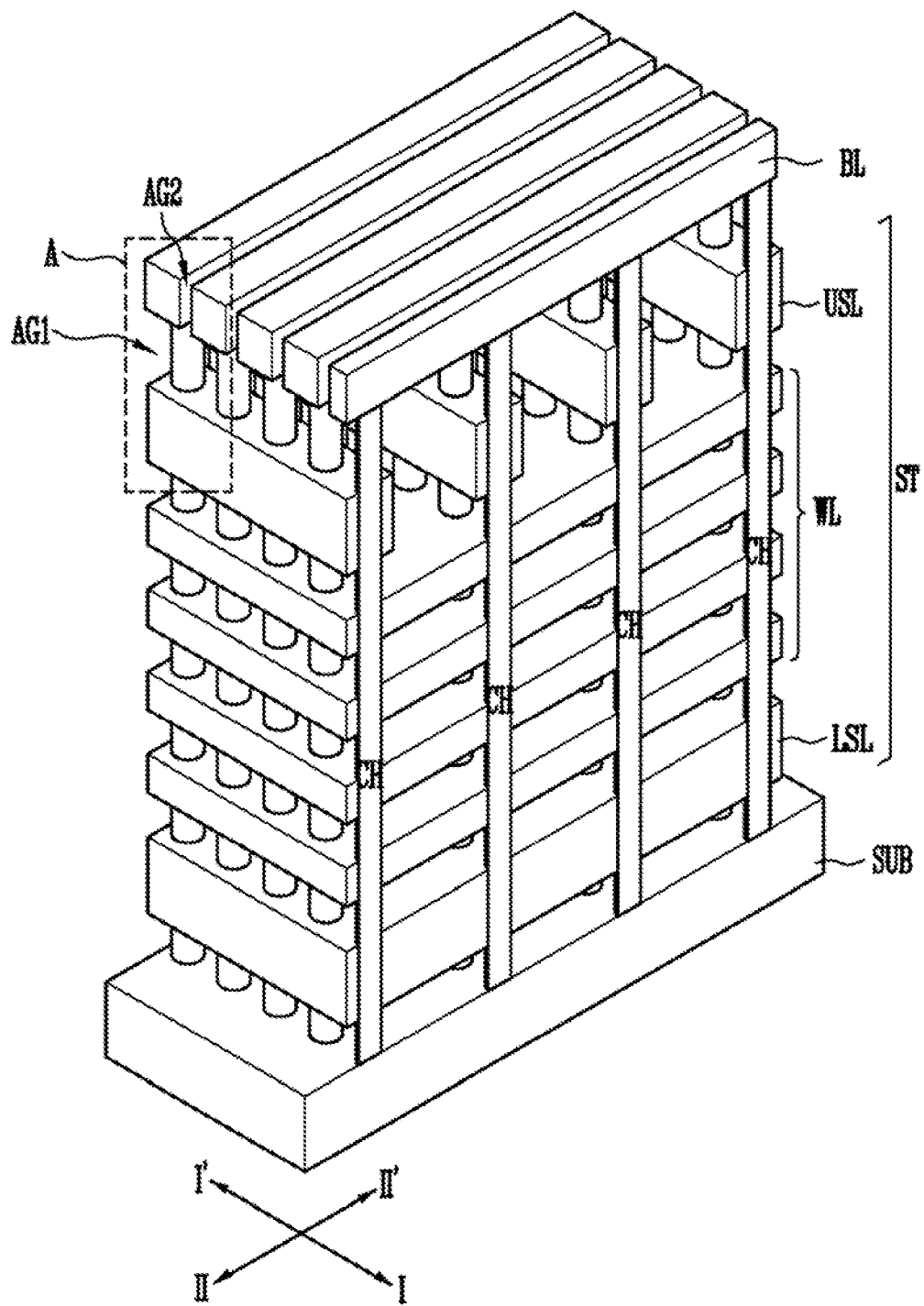
Figure 2C:
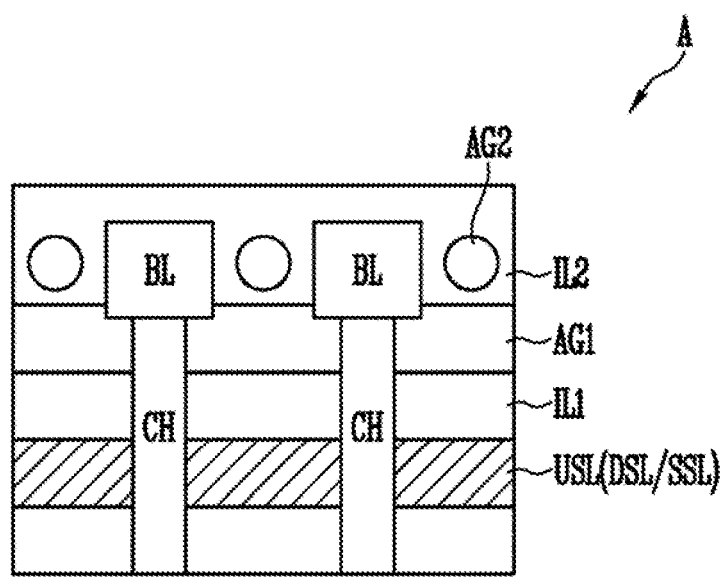
FIG. 2C is an enlarged view of a region "A" of FIGS. 2A and 2B.

FIGS. 2A and 2B are perspective views illustrating a semiconductor device according to an embodiment of the present invention, and FIG. 2C is an enlarged view showing a region "A" of FIGS. 2A and 2B. In FIGS. 2A and 2B, however, the insulating layers are omitted for convenience of description.

As shown in FIGS. 2A and 2C, the semiconductor device includes U-shaped and W-shaped channel layers arranged in a first direction (I-I') and a second direction (II-II') intersecting the first direction (I-I'). Here, the channel layers CH may include a pipe channel layer P_CH and source and drain side channel layers S_CH and D_CH that connected to the pipe channel layer P_CH. The channel layers CH are shown to be arranged in a matrix form in this drawing, but may be arranged in a zigzag form to enhance the integration degree.

The semiconductor device includes conductive layers and insulating layers alternately stacked on a substrate SUB. Here, the conductive layers include a pipe gate PG, source side word lines S_WL, drain side word lines D_WL, source selection lines SSL, and drain selection lines DSL. The pipe gate PG, word lines WL, drain selection lines DSL, and source selection lines SSL are stacked to surround the channel layer CH. For example, the pipe gate PG surrounds the pipe channel layer P_CH. In addition, the source side word lines S_WL and the source selection lines SSL are stacked to surround at least one column of source side channel layers S_CH, and the drain side word lines D_WL and the drain selection lines DSL are stacked to surround at least one column of drain side channel layers D_CH.

The semiconductor device may further include a memory layer (not shown) disposed between the channel layers CH and word lines S_WL and D_WL. The memory layer may include a tunnel insulating layer, a data storing layer, and a charge blocking layer. For example, the data storing layer may include a trap layer such as a nitride layer, a floating gate such as a polysilicon layer, a nanodot, a phase change material layer, and so on.

The semiconductor device may further include a source line SL connected to the source side channel layers S_CH and bit lines BL connected to the drain side channel layers D_CH. Here, the source line SL and bit lines BL may extend in a mutually intersecting direction.

In addition, the semiconductor device may include the first air gap AG1 and may further include the second air gaps AG2. Referring to FIG. 2C, the first air gap AG1 may be positioned under the bit lines BL and defined between a first insulating layer IL1 and a second insulating layer IL2. In addition, the second air gaps AG2 may be positioned in the second insulating layer IL2 and defined between the bit lines BL. For reference, although not shown in the drawing, a contact plug may be disposed between the bit lines BL and the channel layers CH.

According to such a structure, drain selection transistors DST are positioned in a region where the channel layer CH and the drain selection lines DSL are intersected, source selection transistors SST are positioned in a region where the channel layer CH and the source selection lines SSL are intersected, and memory cells MC are positioned in a region where the channel layer CH and the word lines WL are intersected. Accordingly, at least one drain selection transistor, a plurality of memory cells, a pipe transistor, a plurality of memory cells, and at least one source selection transistor that are connected in series, constitute one string, and a plurality of strings are arranged in a "U" shape.

In addition, the first air gap AG1 may be defined between the bit lines BL and a top conductive layer (e.g., drain selection line or source selection line), or the second air gaps AG2 may be defined between bit lines BL that are adjacent in the first direction (I-I'), thereby improving the loading effect of the bit lines BL and program characteristics.

As shown in FIGS. 2B and 2C, the semiconductor device may include the channel layers CH arranged in the first direction (I-I') and the second direction (II-II') to protrude from the substrate SUB including a source region (not shown). The channel layers CH are shown to be arranged in a matrix form in this drawing, but may be arranged in a zigzag form to enhance the integration degree.

The semiconductor device according to an embodiment of the present invention includes conductive layers and insulating layers alternately stacked on the substrate SUB. Here, the conductive layers may include lower selection lines LSL, word lines WL, and upper selection lines USL. The lower selection lines LSL, word lines WL, and upper selection lines USL are stacked to surround at least one channel column. Alternatively, the lower selection lines LSL, word lines WL, and upper selection lines USL may have a plate shape or a line shape extending in the first direction (I-I').

The semiconductor device may further include a memory layer (not shown) disposed between the channel layers CH and word lines WL. The memory layer may include a tunnel insulating layer, a data storing layer, and a charge blocking layer. For example, the data storing layer includes a trap layer such as a nitride layer, a floating gate such as a polysilicon layer, a nanodot, a phase change material layer, and so on.

The semiconductor device may further include the bit lines BL connected to the channel layers CH. For example, the bit lines BL may extend in the second direction (II-II').

In addition, the semiconductor device may include the first air gap AG1 and may further include the second air gaps AG2. Referring to FIG. 2C, the first air gap AG1 may be positioned under the bit lines BL and defined between the first insulating layer IL1 and the second insulating layer IL2. In addition, the second air gaps AG2 may be positioned in the second insulating layer IL2 and defined between the bit lines BL. For reference, although not shown in the drawing, a contact plug may be disposed between the bit lines BL and the channel layers CH.

According to such a structure, at least one lower selection transistor, a plurality of memory cells, and at least one upper selection transistor that are connected in series, constitute one string, and a plurality of strings are arranged vertically.

In addition, the first air gap AG1 may be defined between the bit lines BL and a top conductive layer (i.e., upper selection line), or the second air gaps AG2 may be defined between the bit lines BL that are adjacent in the first direction (I-I'), thereby improving the loading effect of the bit lines BL and program characteristics.

In the above-described embodiment, a three-dimensional semiconductor device with stacked memory cells has been described. However, the present invention is not limited thereto. The embodiment of the present invention may be applied to a two-dimensional semiconductor device having memory cells arranged horizontally, and also a variety of semiconductor devices including interconnection lines, such as a volatile memory element, non-volatile memory element, etc. In addition, in the above-described embodiment, a case where the first and second air gaps AG1 and AG2 are defined near bit lines of the semiconductor device has been described. However, the present invention is not limited thereto. An embodiment of the present invention may be applied to a variety of interconnection lines such as a word line, a selection line, etc.

For example, the above-described interconnection lines may be source and drain selection lines SSL and DSL. In this case, the first air gap AG1 is defined between the source and drain selection lines SSL and DSL and a top word line WL, and the second air gaps AG2 are defined between adjacent source and drain selection lines SSL and DSL.

FIG. 3 illustrates an interconnection line layout of the semiconductor device according to an embodiment of the present invention.

As shown in FIG. 3, the semiconductor device may include a plurality of interconnection lines L and at least one dummy line DL. Here, the interconnection lines L may be bit lines, and the dummy line DL may be formed when the bit lines are formed. Each bit line may be connected to a page buffer and may deliver a signal to a memory cell. Here, the dummy line DL may be disconnected (or floated) and positioned in a peripheral circuit region, a dummy region, a guide region, or the like.

The semiconductor device may further include a dummy contact plug DCP connected to the dummy line DL. The dummy contact plug DCP may be positioned in the peripheral circuit region, dummy region, or guide region. Further, the above-described first air gap AG1 may be formed using a process of forming the dummy contact plug DCP. This will be described below with reference to FIG. 4D.

FIGS. 4A to 4E are cross-sectional views illustrating a method of manufacturing an interconnection structure according to an embodiment of the present invention.

Figure 4A:
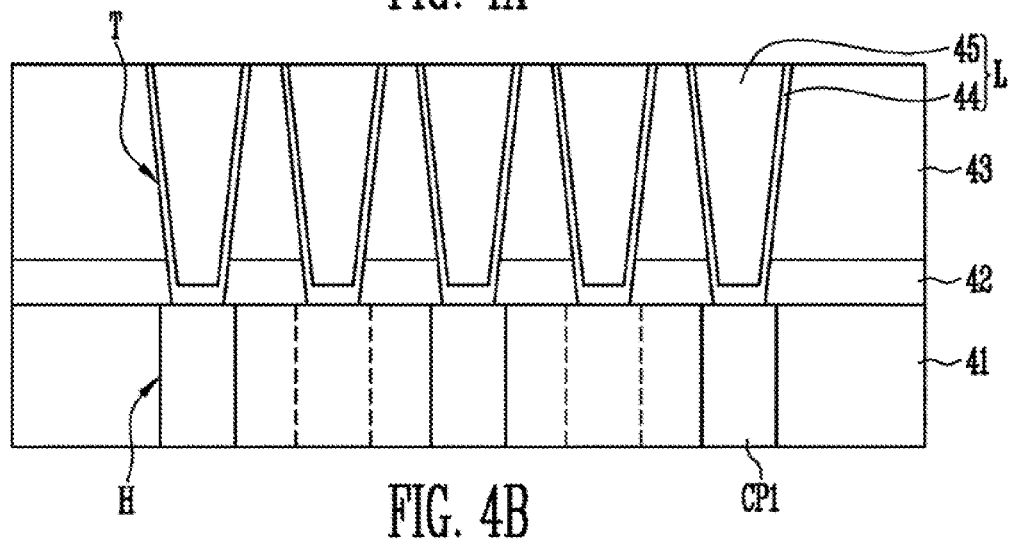
FIGS. 4A to 4E are cross-sectional views illustrating a method of manufacturing the interconnection structure according to an embodiment of the present invention.

As shown in FIG. 4A, the method sequentially forms a first insulating layer 41, an etch stop layer 42, and a sacrificial layer 43 on a substrate (not shown) having a lower structure formed therein. Here, the lower structure may be a channel layer, a lower interconnection line, and a contact plug, which protrude from the substrate. In addition, the etch stop layer 42 may include a material with relatively high permittivity, compared to the first insulating layer 41 and the sacrificial layer 43. In addition, the first insulating layer 41 and the sacrificial layer 43 may include an oxide, and the etch stop layer 42 may include a nitride.

The first insulating layer 41 may include a plurality of first contact plugs CP1 passing through the first insulating layer 41. Further, the sacrificial layer 43 may include a plurality of interconnection lines L connected to the first contact plugs CP1.

Here, the first contact plugs CP1 may be arranged in a zigzag form to enhance the integration degree. In the drawing, the first contact plugs CP1 positioned behind with respect to a cross section have been shown: in a dotted line, in order to represent that the arranged first contact plugs CP1 are zigzaggedly arranged.

In addition, each of the interconnection lines L may include a barrier layer 44 and a metal layer 45. For example, the method forms the barrier layer 44 on the sacrificial layer 43 in which interconnection line trenches T are formed and then forms the metal layer 45 to fill the trenches T. Subsequently, the method forms the interconnection lines L by performing a planarization process such that a top of the sacrificial layer 43 may be exposed.

Depending on the manufacturing process, positions of the first contact plugs CP1 and interconnection lines L may be changed.

As an example, the method forms a plurality of holes H passing through the first insulating layer 41 and then fills the plurality of holes with a conductive layer to form a plurality of first contact plugs CP1. Subsequently, the method forms the etch stop layer 42 and the sacrificial layer 43 on the first insulating layer 41 and then forms a mask pattern (not shown) on the sacrificial layer 43. Subsequently, the method etches the sacrificial layer 43 and the etch stop layer 42 using the mask pattern as an etch barrier to form a plurality of trenches T. Next, the method forms interconnection lines L in the plurality of trenches T. In this case, the first contact plugs CP1 are formed to pass through the first insulating layer 41, and the interconnection lines L are formed to pass through the etch stop layer 42 and the sacrificial layer 43.

As another example, the method forms a plurality of holes H passing through the etch stop layer 42 and the first insulating layer 41 and then fills the plurality of holes with a conductive layer to form a plurality of first contact plugs CP1. Subsequently, the method forms the sacrificial layer 43 on the etch stop layer 42, and then forms a mask pattern (not shown) on the sacrificial layer 43. Next, the method etches the sacrificial layer 43 using the mask pattern as an etch barrier to form a plurality of trenches T. Next, the method forms interconnection lines L in the plurality of trenches T. In this case, the first contact plugs CP1 are formed to pass through the first insulating layer 41 and the etch stop layer 42, and the interconnection lines L are formed to pass through the sacrificial layer 43.

Figure 4B:
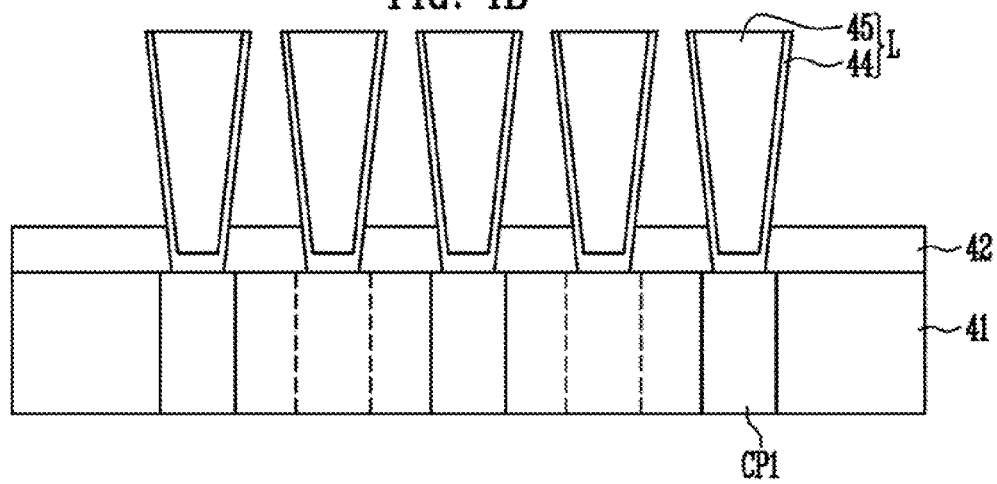

As shown in FIG. 4B, the method selectively removes the sacrificial layer 43 to expose the interconnection lines L and the etch stop layer 42. Thus, the sacrificial layer 43 disposed between adjacent interconnection lines L may be removed.

Figure 4C:
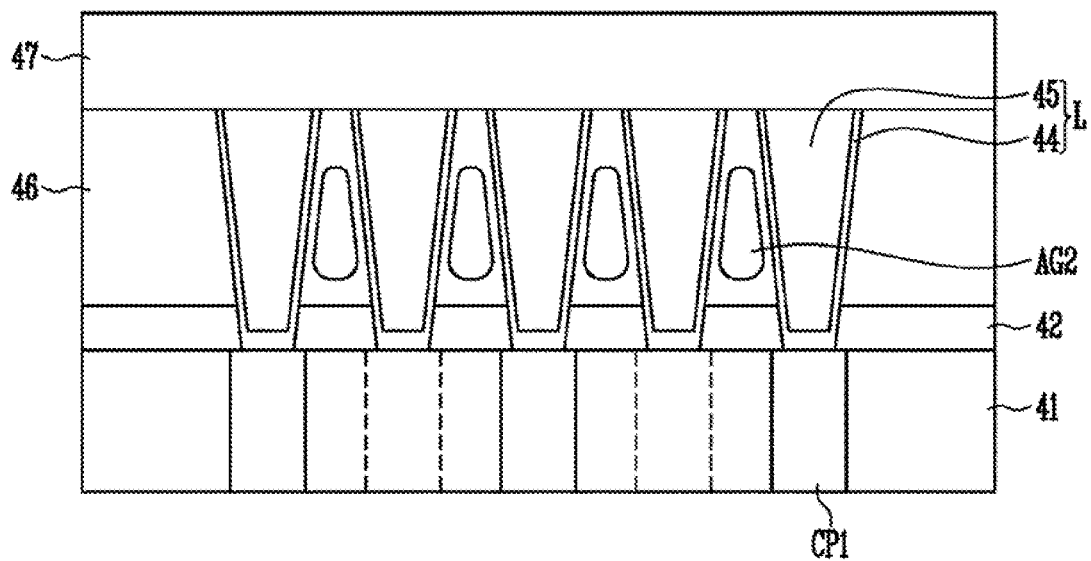

As shown in FIG. 4C, the method forms a second insulating layer 46 on the etch stop layer 42 on which the interconnection lines L are exposed. In this case, the second insulating layer 46 is formed of a material having low step coverage, so that a gap region between the interconnection lines L is not fully filled. For example, the second insulating layer 46 includes an oxide formed by plasma enhanced chemical vapor deposition (PECVD). Thus, the method may define second air gaps AG2 between the interconnection lines L.

Subsequently, the method may planarize the second insulating layer 46 to expose upper portions of the interconnection lines L and then further form a third insulating layer 47 on the second insulating layer 46. For example, the third insulating layer 47 may include an oxide.

Figure 4D:
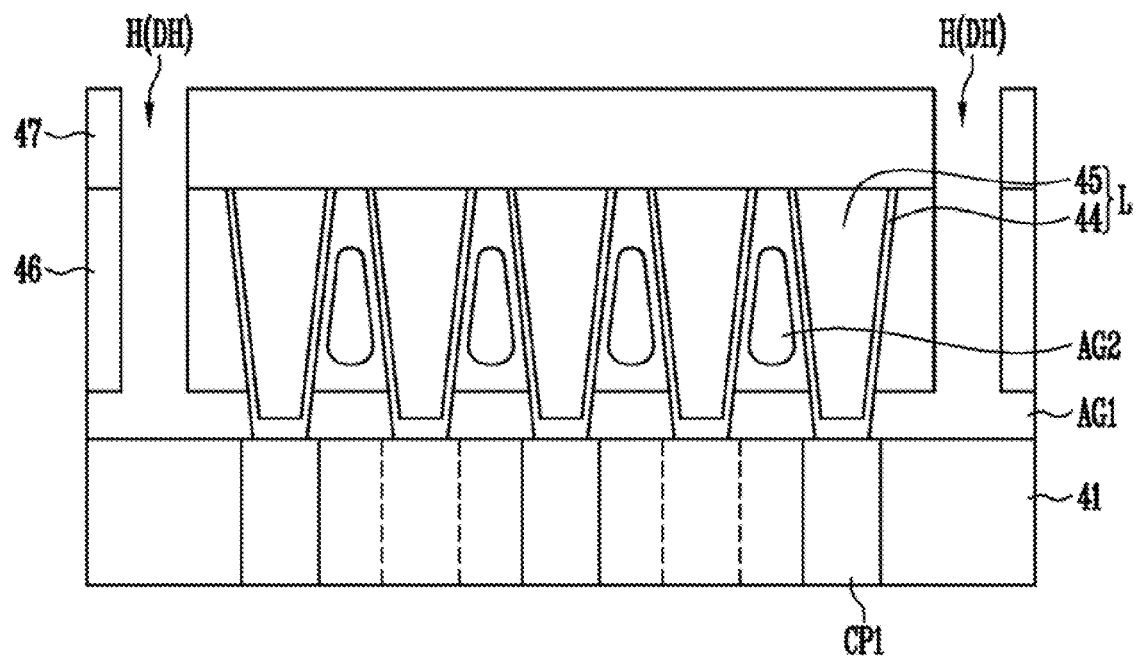

As shown in FIG. 4D, the method forms at least one hole H passing through the second and third insulating layers 46 and 47 to expose the etch stop layer 42. Here, the hole H may be a dummy hole DH in which a dummy contact plug is formed in a subsequent process. The dummy hole DH may be positioned in the dummy region, peripheral region, guide region, or the like. The hole H may be formed in a separate process or together with another contact hole. For example, the hole H may be formed when contact plugs connected to the stacked conductive layers shown in FIGS. 2A and 2B are formed.

Subsequently, the method removes the etch stop layer 42 by using the hole H. For example, the etch stop layer 42 is removed by a phosphoric acid dip-out process. Thus, the first air gap AG1 is defined between the first insulating layer 41 and the second insulating layer 46.

Figure 4E:
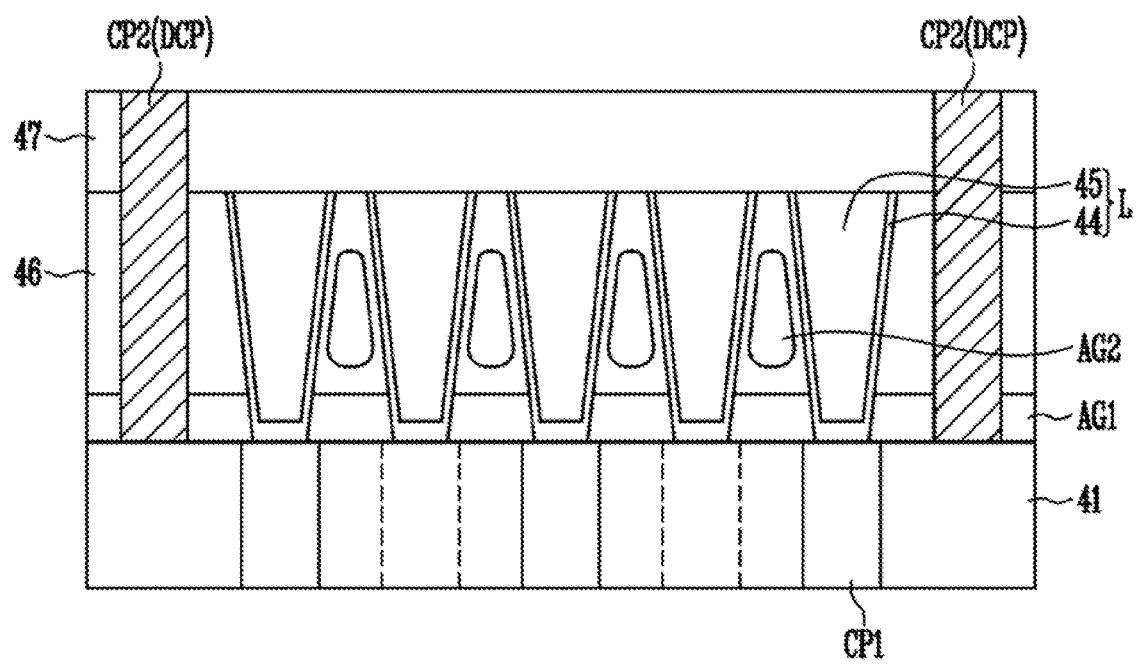

As shown in FIG. 4E, the method fills the hole H with a conductive layer to form a second contact plug CP2. Here, the second contact plug CP2 may be a dummy contact plug DCP.

For reference, a case where the interconnection structure includes both the first and second air gaps AG1 and AG2 has been described in the embodiment of the present invention. However, it may be possible to include only one of the first and second air gaps AG1 and AG2. For example, when the interconnection structure includes only the first air gap AG1, the processes described with reference to FIGS. 4B and 4C may be omitted. In this case, the first air gap AG1 may be defined by removing the etch stop layer 42 by using the hole passing through the sacrificial layer 43.

According to the manufacturing process as described above, the first air gap AG1 replaces the etch stop layer 42 having relatively high permittivity. Accordingly, it may be possible to effectively reduce capacitance between the interconnection lines L. Moreover, since the etch stop layer 42 is removed in a process of forming a dummy contact plug, the first air gap AG1 may be formed without a separate process.

The interconnection structure according to the embodiment of the present invention may be included in a semiconductor device. The semiconductor device may further include memory cells (not shown) formed on a substrate (not shown). In this case, before forming the first insulating layer 41, the method forms alternately stacked conductive layers and insulating layers and a plurality of channel layers connected to the interconnection lines through the alternately stacked conductive layers and insulating layers.

Figure 5:
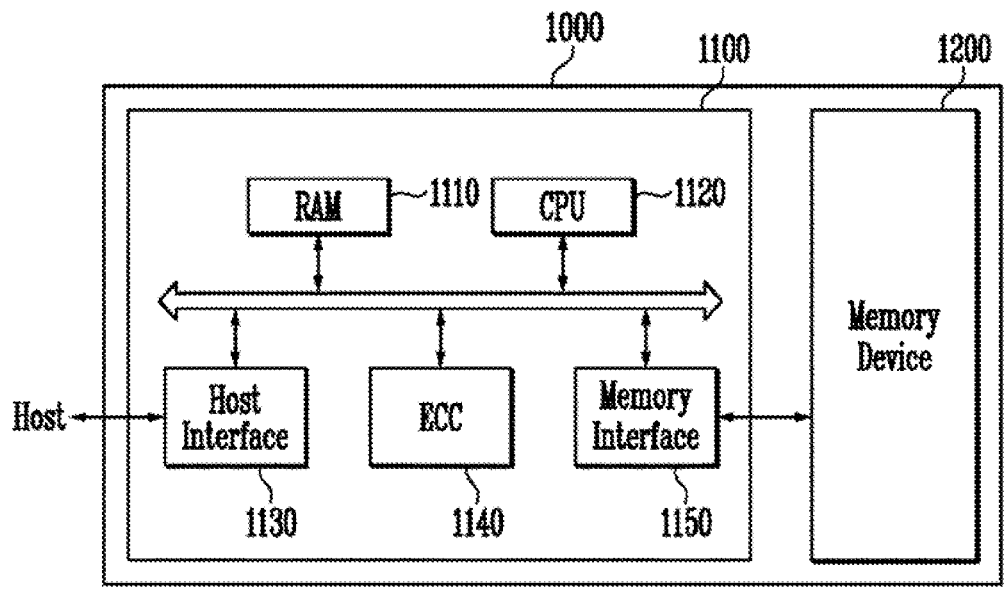
FIG. 5 is a block diagram illustrating a memory system according to an embodiment of the present invention.

FIG. 5 is a block diagram illustrating a memory system 1000 according to an embodiment of the present invention.

As shown in FIG. 5, the memory system 1000 may include a memory device 1200 and a controller 1100.

The memory device 1200 is used to store data information having various data types, such as a text, graphic, software code, and the like. The memory device 1200 may be a non-volatile memory, and a semiconductor device described with reference to FIGS. 1A to 4E. In addition, the memory device 1200 may include a first insulating layer, a second insulating layer formed on the first insulating layer, a plurality of interconnection lines formed in the second insulating layer, and a first air gap defined between the first insulating layer and the second insulating layer. The structure and manufacturing method of the memory device 1200 are the same as those described above. Thus, detailed description thereof will be omitted.

The controller 1100 is connected to a host and the memory device 1200 and may access the memory device 1200 in response to a request from the host. For example, the controller 1100 may control reading, writing, erasing, and background operations of the memory device 1200.

The controller 1100 may include a random access memory (RAM) 1110, a central processing unit (CPU) 1120, a host interface 1130, an error correction code (ECC) circuit 1140, and a memory interface 1150.

Here, the RAM 1110 may be used as an operation memory of the CPU 1120, a cache memory between the memory device 1200 and the host, and/or a buffer memory between the memory device 1200 and the host. For reference, the RAM 1110 may be replaced with a static random access memory (SRAM), read only memory (ROM), or the like.

The CPU 1120 may control overall operations of the controller 1100. For example, the CPU 1120 may run firmware such as a flash translation layer (FTL) stored in the RAM 1110.

The host interface 1130 may interface with the host. For example, the controller 1100 communicates with the host via at least one of a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The ECC circuit 1140 may detect and correct an error included in data read from the memory device 1200, using an error correction: code (ECC).

The memory interface 1150 may interface with the memory device 1200. For example, the memory interface 1150 includes a NAND flash interface or a NOR flash interface.

For reference, the controller 1100 may further include a buffer memory (not shown) for temporarily storing data. Here, the buffer memory may be used to temporarily store data delivered to the outside through the host interface 1130 or temporarily store data delivered from the memory device 1200 through the memory interface 1150. In addition, the controller 1100 may further include a ROM that stores code data for interfacing with the host.

In addition, the interconnection structure according to the embodiment of the present invention may be applied to the RAM 1110, CPU 1120, host interface 1130, ECC circuit 1140, and memory interface 1150, which are included in the memory system 1000, as well as the memory device 1200.

As such, the memory system 1000 according to the embodiment of the present invention may include the memory device 1200 with reduced capacitance and thus improved driving speed, thereby enhancing characteristics of the memory system 1000.

Figure 6:
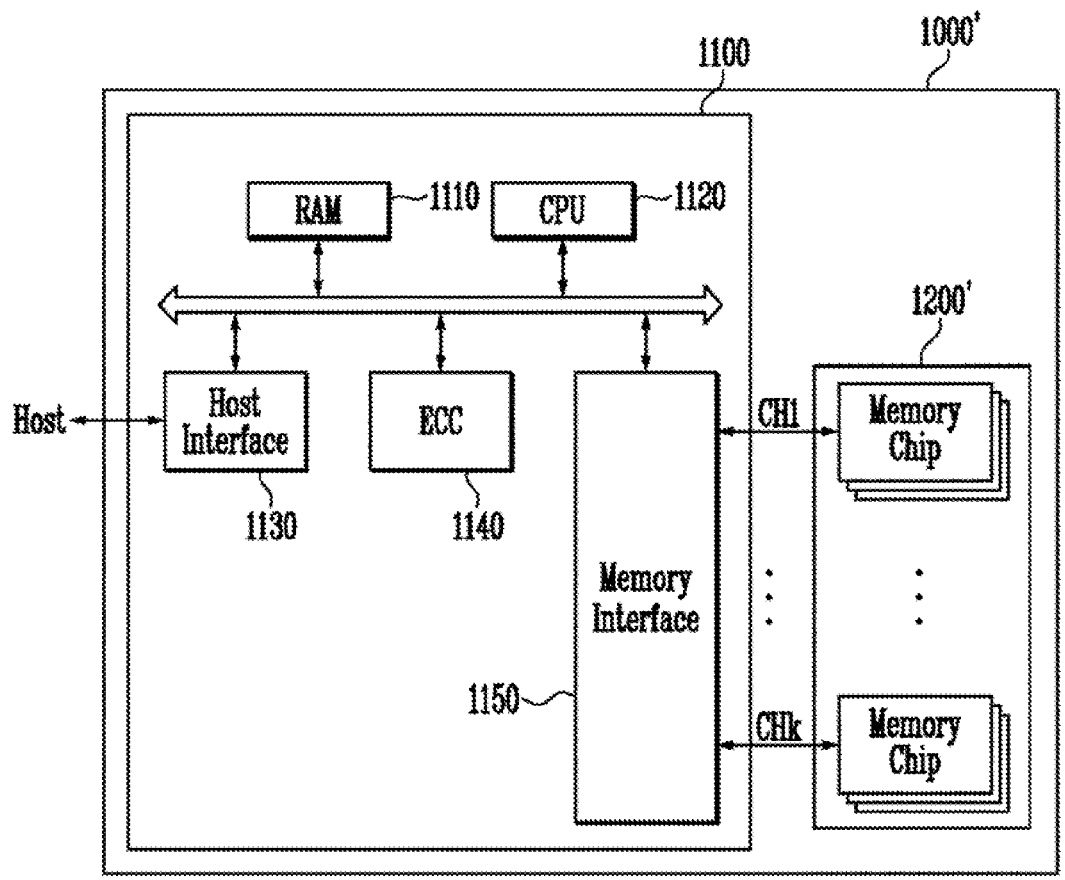
FIG. 6 is a block diagram illustrating a memory system according to an embodiment of the present invention.

FIG. 6 is a block diagram illustrating a memory system 1000' according to an embodiment of the present invention. Hereinafter, the description of the same as those described above will be omitted.

As shown in FIG. 6, the memory system 1000' may include a memory device 1200' and the controller 1100. In addition, the controller 1100 may include the RAM 1110, the CPU 1120, the host interface 1130, the ECC circuit 1140, and the memory interface 1150.

The memory device 1200' may be a non-volatile memory, and a semiconductor device described with reference to FIGS. 1A to 4E. In addition, the memory device 1200' may include a first insulating layer, a second insulating layer formed on the first insulating layer, a plurality of interconnection lines formed in the second insulating layer, and a first air gap defined between the first insulating layer and the second insulating layer. The structure and manufacturing method of the memory device 1200' are the same as those described above. Thus, detailed description thereof will be omitted.

In addition, the memory device 1200' may be a multi-chip package including a plurality of memory chips. The plurality of memory chips are grouped into a plurality of groups, and the plurality of groups may communicate with the controller 1100 over first to kth channels CH1 to CHk. Furthermore, memory chips included in one group may communicate with the controller 1100 over a common channel. For reference, the memory system 1000' may be changed such that one memory chip is connected to one channel.

In addition, the interconnection structure according to the embodiment of the present invention may be applied to the RAM 1110, CPU 1120, host interface 1130, ECC circuit 1140, and memory interface 1150, which are included in the memory system 1000', as well as the memory device 1200'.

As such, the memory system 1000' according to the embodiment of the present invention may include the memory device 1200' with reduced capacitance and thus improved driving speed, thereby enhancing characteristics of the memory system 1000'. Moreover, by configuring the memory device 1200' as a multi-chip package, it may be possible to increase data storage capacity of the memory system 1000' and enhance a driving speed thereof.

Figure 7:
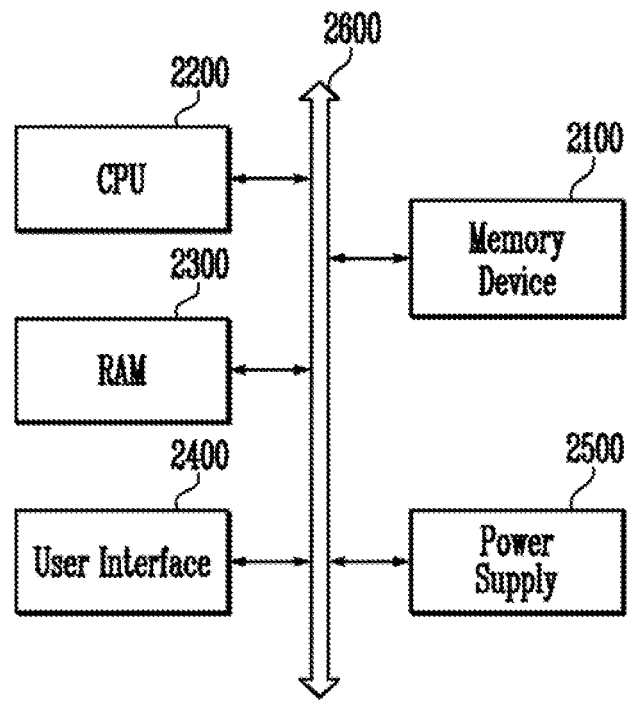
FIG. 7 is a block diagram illustrating a computing system according to an embodiment of the present invention.

FIG. 7 is a block diagram illustrating a computing system 2000 according to an embodiment of the present invention. Hereinafter, the description of the same as those described above will be omitted.

As shown in FIG. 7, the computing system 2000 may include a memory device 2100, a CPU 2200, a RAM 2300, a user interface 2400, a power supply 2500, and a system bus 2600.

The memory device 2100 stores data provided through the user interface 2400, data processed by the CPU 2200, and the like. In addition, the memory device 2100 is electrically connected to the CPU 2200, the RAM 2300, the user interface 2400, and the power supply 2500 through the system bus 2600. For example, the memory device 2100 may be directly connected to the system bus 2600 or may be connected to the system bus 2600 through: a memory controller (not shown). When the memory device 2100 is directly connected to the system bus 2600, functions of the memory controller may be performed by the CPU 2200 and the RAM 2300.

Here, the memory device 2100 may be a non-volatile memory, and a semiconductor device described with reference to FIGS. 1A to 4E. In addition, the memory device 2100 includes a first insulating layer, a second insulating layer formed on the first insulating layer, a plurality of interconnection lines formed in the second insulating layer, and a first air gap defined between the first insulating layer and the second insulating layer. The structure and manufacturing method of the memory device 2100 are the same as those described above. Thus, detailed description thereof will be omitted.

In addition, the memory device 2100 may be a multi-chip package including a plurality of memory chips, as described with reference to FIG. 6.

The computing system 2000 may be a computer, a ultra mobile PC (UMPC), a workstation, a net book, a personal digital assistant (PDA), a portable computer, a web tablet, a wireless phone, a mobile phone, a smartphone, an e-book, a portable multimedia player (PMP), a portable gaming console, a navigation device, a black box, a digital camera, a 3-dimensional television, a digital audio recorder, a digital audio player, a digital picture recorder, a digital picture player, a digital video recorder, a digital video player, a device for communicating information in a wireless environment, one of various electronic devices constituting a home network, one of various electronic devices constituting a computer network, one of various electronic devices constituting a telematics network, an RFID device, or the like.

In addition, the interconnection structure according to the embodiment of the present invention may be applied to the RAM 2300, CPU 2200, user interface 2400, power supply 2500, system bus 2600, which are included in the computing system 2000, as well as the memory device 2100.

As such, the computing system 2000 according to the embodiment of the present invention may include the memory device 2100 with reduced capacitance and thus improved driving speed, thereby enhancing characteristics of the computing system 2000.

Figure 8:
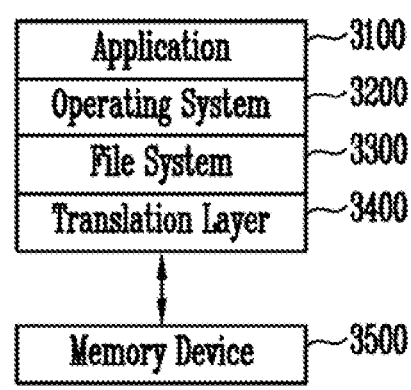
FIG. 8 is a block diagram illustrating a computing system according to an embodiment of the present invention.

FIG. 8 is a block diagram illustrating a computing system 3000 according to an embodiment of the present invention.

As shown in FIG. 8, the computing system 3000 may include a software layer including an operating system 3100, an application 3200, a file system 3300, and a translation layer 3400. In addition, the computing system 3000 may include a hardware layer of the memory device 3500.

The operating system 3100 is a collection of software that manages hardware resources of the computing system 3000 and may control program execution by a central processing unit. The application 3200 is a variety of application programs that run on the computing system 3000, and may be a utility that is carried out by the operating system 3100.

The file system 3300 means a logical structure for managing data or a file, which is included in the computing system 3000, and organizes a file or data to be stored in the memory device 3500 according to a rule. The file system 3300 may be determined depending on the operating system 3100 used in the computing system 3000. For example, if the operating system 3100 is one of the Windows families of Microsoft, the file system 3300 may be a file allocation table (FAT), an NT file system (NTFS), or the like. In addition, if the operating system 3100 is one of the Unix/Linux families, the file system 3300 may be an extended file system (EXT). Unix file system (UFS), journaling file system (JFS), or the like.

The operating system 3100, the application 3200, and the file system 3300 are shown as separate blocks in this drawing. However, the application 3200 and the file system 3300 may be included in the operating system 3100.

The translation layer 3400 translates an address into a form suitable for the memory device 3500 in response to a request from the file system 3300. For example, the translation layer 3400 translates a logical address created by the file system 3300 into a physical address of the memory device 3500. Here, mapping information between the logical address and the physical address may be stored as an address translation table. For example, the translation layer 3400 may be a flash translation layer (FTL), a universal flash storage link layer (ULL), or the like.

The memory device 3500 may be a non-volatile memory, and a semiconductor device described with reference to FIGS. 1A to 4E. In addition, the memory device 3500 includes a first insulating layer, a second insulating layer formed on the first insulating layer, a plurality of interconnection lines formed in the second insulating layer, and a first air gap defined between the first insulating layer and the second insulating layer. The structure and manufacturing method of the memory device 3500 are the same as those described above. Thus, detailed description thereof will be omitted.

The computing system 3000 may be divided into an operating system layer performed in an upper level region and a controller layer performed in a lower level region. Here, the application 3100, the operating system 3200, and the file system 3300 may be included in the operating system layer and driven by an operation memory of the computing system 3000. In addition, the translation layer 3400 may be included in the operating system layer or controller layer.

In addition, the interconnection structure according to the embodiment of the present invention may be also applied to a hardware layer included in the computing system 3000, as well as the memory device 3500.

As such, the computing system 3000 may include the memory device 3500 with reduced capacitance and improved driving speed, thereby enhancing characteristics of the computing system 3000.

The interconnection structure includes a first air gap positioned under interconnection lines. Furthermore, the interconnection structure may further include a second air gap positioned between adjacent interconnection lines. Accordingly, the capacitance between the adjacent interconnection lines may be reduced, and thus a loading effect of the interconnection line and program characteristics may be improved.

The technical idea of the present invention has been specifically described with respect to the preferred embodiments, but it should be noted that the embodiments are provided only for illustration while not limiting the present invention. Therefore, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
   forming an etch stop layer on a first insulating layer;
   forming a second insulating layer on the etch stop layer, wherein the second insulating layer includes' a plurality of interconnection lines;
   forming a hole passing through the second insulating layer to expose the etch stop layer;
   removing the etch stop layer through the hole to form a first air gap, and
   forming a dummy contact plug in the hole, wherein the dummy contact plug passes through the second insulating layer and extends into the first air gap so that a lower part of the dummy contact plug is exposed in the first air gap.

2. The method of claim 1, wherein the forming of the second insulating layer comprises:
   forming a sacrificial layer on the etch stop layer;
   forming the interconnection lines passing through the sacrificial layer;
   removing the sacrificial layer to expose the interconnection lines; and
   forming the second insulating layer including a plurality of second air gaps defined between the interconnection lines.

3. The method of claim 1, wherein the second insulating layer includes an oxide formed by plasma enhanced chemical vapor deposition (PECVD).

4. The method of claim 1, wherein the interconnection lines are bit lines.

5. The method of claim 1, further comprising:
   forming conductive layers and insulating layers alternately stacked, and a plurality of channel layers connected to the interconnection lines through the conductive layers and insulating layers, before forming the first insulating layer.

6. The method of claim 1, further comprising:
   forming a plurality of contact plugs passing through the first insulating layer, before forming the etch stop layer.

7. The method of claim 1, wherein the etch stop layer is selectively removed so that lower parts of the interconnection lines are exposed in the first air gap.

8. The method of claim 1, wherein the first air gap is interposed between the first insulating layer and the second insulating layer so that a lower surface of the second insulating layer is exposed in the first air gap.

9. The method of claim 1, wherein the etch stop layer includes a material with relatively high permittivity with respect to the first insulating layer.

10. The method of claim 1, wherein the first insulating layer includes an oxide, and the etch stop layer includes a nitride.

11. A method of manufacturing a semiconductor device, the method comprising:

forming an etch stop layer on a first insulating layer;
forming a sacrificial layer on the etch stop layer;
forming interconnection lines passing through the sacrificial layer and the etch stop layer;
forming gaps between neighbored interconnection lines by selectively removing the sacrificial layer; and
forming a second insulating layer in the gaps, the second insulating layer including first air gaps located between the interconnection lines;
forming a hole passing through the second insulating layer to expose the etch stop layer; and
forming a second air gap interposed between the first insulating layer and the second insulating layer by selectively removing the etch stop layer through the hole,
wherein lower parts of the interconnection lines are exposed in the second air gap.

12. The method of claim 11, further comprising:
forming a dummy contact plug in the hole, wherein the dummy contact plug passes through the second insulating layer and extends into the second air gap so that a lower part of the dummy contact plug is exposed in the second air gap.

13. The method of claim 11, wherein a lower surface of the second insulating layer is exposed in the second air gap.

14. The method of claim 11, wherein the etch stop layer includes a material with relatively high permittivity with respect to the first insulating layer and the sacrificial layer.

15. The method of claim 11, wherein the first insulating layer and the sacrificial layer include an oxide, and the etch stop layer includes a nitride.

* * * * *